SEMICONDUCTOR PROCESS FOR JOINING A TRANSISTOR CHIP TO A PRINTED CIRCUIT

Filed March 27, 1968

INVENTORS.
Howard S. Best
Robert E. Bowser
By Walter S. Zebrowski
ATTORNEY

1

3,561,107

SEMICONDUCTOR PROCESS FOR JOINING A TRANSISTOR CHIP TO A PRINTED CIRCUIT

Howard S. Best, Horseheads, and Robert E. Bowser, Big Flats, N.Y., assignors to Corning Glass Works, Corning, N.Y., a corporation of New York Continuation-in-part of application Ser. No. 415,314, Dec. 2, 1964. This application Mar. 27, 1968, Ser. No. 716,568
The portion of the term of the patent subsequent to Oct. 1, 1985, has been disclaimed
Int. Cl. B01j *17/00;* H01l *1/16, 1/24, 7/68*
U.S. Cl. 29—577 4 Claims

ABSTRACT OF THE DISCLOSURE

A method of attaching transistors to printed circuits or microcircuits by employing conductive pillars bonded or welded to contact areas on each. The pillars are first attached to contact areas on the transistor chip.

CROSS REFERENCE TO RELATED APPLICATIONS

This application is a continuation-in-part of application Ser. No. 415,314, filed Dec. 2, 1964, now Pat. No. 3,403,438.

BACKGROUND OF THE INVENTION

This invention applies to semiconductor devices generally but for the purposes of simplicity it will be described in connection with transistors. Transistors have contacts or contact areas for the collector, emitter, and base. Heretofore, wires were connected between these transistor contacts and external leads embodied within the enclosure in which the transistor was mounted by means of thermocompression bonding or the like. Such wires had to be individually connected which was very time consuming and consequently very costly. Since the connections are very small it was difficult to make acceptable connections consistently. Furthermore, although the wires were connected at both ends, they were nevertheless free floating in between the ends often resulting in unsound mechanical connections. The free floating portion of these wires was able to move which often caused undue stress to be placed on the rigid welds at the ends thereof and particularly the ends bonded to the transistor contacts. In addition, the bonding itself frequently weakened the wires while the connections were being made.

After the transistor was enclosed, it would be connected to a circuit by means of said external leads which required additional connections that could also fail, as well as additional time and expense. Furthermore, such transistor attachment required much space.

SUMMARY OF THE INVENTION

It is an object of the present invention to overcome the hereinabove difficulties and to provide a simple, inexpensive method for attaching transistor chips to printed circuits which is rapid, reproducible, compact, and eliminates failure of mechanical connections between the transistor chip and the circuit.

Broadly, according to the present invention a flat substrate having a printed circuit formed on one of its surfaces and a planar-type transistor chip are provided each having a set of contact areas corresponding in number and position to each other. Solid conductive pillars are welded, attached, or bonded to the contact areas of the transistor chip and the chip is disposed adjacent the printed circuit with the pillars in opposing register with the contact areas on the printed circuit. A force and vibratory energy is applied to the unit so formed to compact the pillars and weld them to the contact areas on said printed circuit whereby the pillars form individual bonds between

2 the contact areas on said printed circuit and the corresponding transistor chip contact areas.

Additional objects, features, and advantages of the present invention will become apparent to those skilled in the art, from the following detailed description and the attached drawings on which, by way of example, only the preferred embodiment of the invention is illustrated.

DETAILED DESCRIPTION

Figures 1, 2, 3:
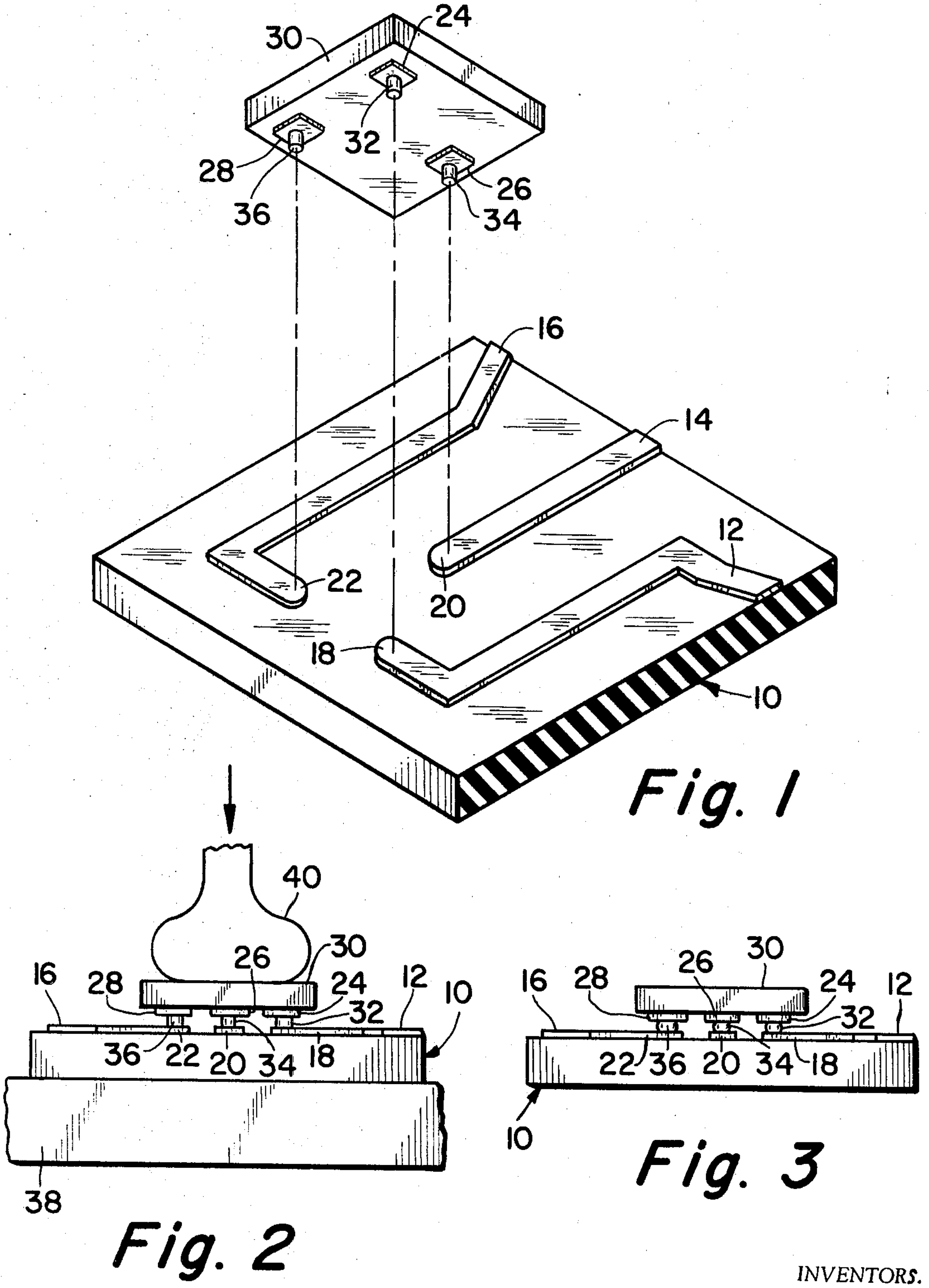
FIG. 1 is an exploded oblique fragmentary view of the article of this invention.
FIG. 2 is a side elevation illustrating a transistor chip being bonded to a printed circuit.
FIG. 3 is a side elevation of the article formed by the method of this invention.

Referring to FIG. 1, dielectric substrate 10 of glass, ceramic, glass-ceramic, plastic, or like material is provided with a printed circuit, illustrated by metallic conductive members 12, 14 and 16 formed on at least one surface thereof. The ends of members 12, 14 and 16 terminate in terminals, contacts, or contact areas 18, 20, and 22 respectively. A printed circuit may be formed by any of several methods well known by one familiar with the art.

Contact areas 18, 20, and 22 are the ends of said conductive members which are arranged in a predetermined desired order to correspond to similar metallic contact areas 24, 26, and 28 formed on transistor chip 30. Contact areas 24, 26, and 28 make electrical contact with the emitter, collector, and base electrodes of chip 30 and are formed by selective vapor deposition, metallizing, or the like methods well known to one familiar with the art.

Solid conductive pillars 32, 34, and 36 are attached, bonded, or welded to contact areas 24, 26, and 28 respectively of transistor chip 30. These pillars can be attached by any means one of which, for example, is taught by U.S. Pat. No. 3,330,026. Transistor chip 30 is disposed with its contact areas and the pillars attached thereto in opposing alignment or register with the contact areas on substrate 10. Contact area 18 is adjacent pillar 32 and contact area 24, contact area 20 is adjacent pillar 34 and contact area 26, and so on. Suitable pillar materials are aluminum, copper, or the like.

Referring now to FIG. 2, the assembly so formed is placed on anvil 38 and vibratory member 40 is brought into contact with chip 30. A force is applied to the assembly and vibratory energy is introduced thereto by means of member 40 to weld each opposing pair of contact plates to the respective contacting pillar or to weld the contact areas on the printed circuit to the corresponding pillars and in either case compact or compress the pillars. In this manner the pillars are welded to corresponding contact areas and form a metallurgical bond and electrical connection therebetween. FIG. 3 illustrates the complete article of this invention.

It has been found that an article produced by the method of this invention is simple, inexpensive and eliminates failure of mechanical connections between the transistor chip and the circuit. In addition, the method may be performed rapidly and reproducibly, and results in a compact article.

Although the present invention has been described with respect to specific details of certain embodiments thereof, it is not intended that such details be limitations upon the scope of the invention except insofar as set forth in the following claims.

We claim:

1. The process of bonding a transistor chip to a printed circuit comprising the steps of:

providing a flat substrate having a printed circuit formed on one surface thereof, said printed circuit having at least one contact area embodied therein in a predetermined desired position, providing a transistor chip having at least one contact area on one surface thereof corresponding in number to said contact areas embodied within said printed circuit and having an opposing arrangement thereto, at least one of said transistor chip contact areas having a solid conductive pillar attached thereto, disposing said chip adjacent said printed circuit with the pillars attached to said chip in register with corresponding contact areas within said printed circuit, applying a force to the unit so formed, introducing vibratory energy to said unit, compacting said pillars, and simultaneously welding said pillars to said contact areas within said printed circuit whereby said compacted pillars form a bond between the contact areas within said printed circuit and the transistor chip contact areas.

2. The process of claim 1 wherein said pillars are simultaneously welded to corresponding printed circuit and transistor chip contact areas.

3. The process of claim 1 wherein said substrate is formed of material selected from the group consisting of glass, ceramic, glass-ceramic, and plastic.

4. The process of claim 1 wherein said conductive pillars are formed of aluminum.

References Cited

UNITED STATES PATENTS

| | | | |
|---|---|---|---|
| 3,071,216 | 1/1963 | Jones et al. | 29—471.1X |
| 3,184,831 | 5/1965 | Siebertz | 29—471.1X |
| 3,235,945 | 2/1966 | Hall, Jr., et al. | 29—492X |
| 3,255,511 | 6/1966 | Weissenstern et al. | 29—472.9X |
| 3,292,240 | 12/1966 | McNutt et al. | 29—501X |
| 3,330,026 | 7/1967 | Best et al. | 29—470.1 |
| 3,340,347 | 9/1967 | Spiegler | 174—F.P. |
| 3,341,649 | 9/1967 | James | 174—F.P. |
| 3,403,438 | 10/1968 | Best et al. | 29—577 |
| 3,488,840 | 1/1970 | Hymes et al. | 29—577X |

JOHN F. CAMPBELL, Primary Examiner

R. J. SHORE, Assistant Examiner

U.S. Cl. X.R.

29—470.1, 473.1, 589; 174—68.5, F.P.